United States Patent
Albert et al.

(10) Patent No.: US 6,515,228 B2
(45) Date of Patent: Feb. 4, 2003

(54) CONTROLLER FOR A MOTOR VEHICLE

(75) Inventors: Roland Albert, Regensburg (DE); Karl Smirra, Wasserburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/151,044

(22) Filed: May 20, 2002

(65) Prior Publication Data

US 2002/0148631 A1 Oct. 17, 2002

Related U.S. Application Data

(63) Continuation of application No. PCT/DE00/04069, filed on Nov. 16, 2000.

(30) Foreign Application Priority Data

Nov. 18, 1999 (DE) .......................................... 199 55 603

(51) Int. Cl.⁷ ................................................ H05K 5/06
(52) U.S. Cl. ..................... 174/52.3; 174/52.1; 361/749; 361/752; 361/810; 439/76.1; 439/76.2
(58) Field of Search ............................... 174/52.3, 52.1; 361/749, 752, 809, 810; 439/76.1, 76.2

(56) References Cited

U.S. PATENT DOCUMENTS

| | | | |
|---|---|---|---|
| 5,247,424 A | * | 9/1993 | Harris et al. ................ 361/704 |
| 5,452,948 A | | 9/1995 | Cooper et al. |
| 5,941,282 A | | 8/1999 | Suzuki et al. |
| 6,183,290 B1 | | 2/2001 | Loibl |
| 6,330,162 B2 | * | 12/2001 | Sakamoto et al. .......... 361/737 |
| 6,300,565 B1 | | 10/2002 | Loibl et al. |

FOREIGN PATENT DOCUMENTS

| | | |
|---|---|---|
| DE | 40 23 319 C1 | 12/1991 |
| DE | 197 12 842 C1 | 8/1998 |
| DE | 197 17 348 A1 | 10/1998 |
| DE | 197 51 095 C1 | 5/1999 |
| DE | 198 17 198 A1 | 10/1999 |
| DE | 198 26 588 C1 | 11/1999 |
| EP | 0 695 117 B1 | 1/1996 |

* cited by examiner

*Primary Examiner*—Hung V. Ngo
(74) *Attorney, Agent, or Firm*—Laurence A. Greenberg; Werner H. Stemer; Ralph E. Locher

(57) ABSTRACT

A controller for motor vehicles has a component support with a sealed housing. A flexible printed circuit board is led through the housing onto a component support. Conductors embedded in the component support form an electrical contact with electrical components. When the controller is manufactured, conductors are embedded in the conductor support. The conductor support is attached to the component support. The electrical contacts between the components and the conductors are then manufactured. The conductor support can preferably be separated, and is therefore particularly movable.

12 Claims, 5 Drawing Sheets

CONTROLLER FOR A MOTOR VEHICLE

CROSS-REFERENCE TO RELATED APPLICATION

This application is a continuation of copending International Application No. PCT/DE00/04069, filed Nov. 16, 2000, which designated the United States and was not published in English.

BACKGROUND OF THE INVENTION

Field of the Invention

The invention relates to a controller for a motor vehicle, in particular a controller which is integrated into the housing of an automatic transmission and which has a component support and a sealed housing for control electronics.

German Patent DE 197 12 842 C1, corresponding to U.S. Pat. No. 6,300,565, discloses a controller that is integrated into the housing of an automatic transmission. A housing lid that seals an electronic system is embodied in one piece with a carrying element. Electrical components are attached to the carrying element. The ends of conductors that are plugged into sockets of a base plate in order to form an electrical connection to a flexible printed circuit board, project from the carrying element. Here, relatively tight tolerances must be observed. At the same time, there is a certain risk of the conductor tracks of the flexible printed circuit board being torn off when the conductor ends are inserted.

German Patent DE 197 51 095 C1, corresponding to U.S. Pat. No. 6,183,290, discloses an electrical connecting configuration in which it is possible to dispense with the contacts between the conductors in the carrying element and the flexible printed circuit board if the flexible printed circuit board is led through the sealed housing of the controller as far as the electrical components. However, the material of the printed circuit board is relatively expensive. Since, for costs reasons, it is usually possible to make contact with only one side of the flexible printed circuit board, the printed circuit board must be partially folded, rotated and bent. This results in a considerable degree of expenditure for the mounting process and in the consumption of material as a result of the folding.

European Patent EP 0 695 117 B1 discloses a controller with a plastic housing in which punched grids are cast. Electronic components are placed in contact with the punched grids in the interior of the housing. However, it is very difficult to achieve an absolute seal with respect to media such as the transmission oil with housing bushings implemented by punched grids.

In German Patent DE 40 23 319 C1, a controller is described which has a heat-conductive plate with a flexible printed circuit board on which electrical components are disposed. Electrical components are protected by hood-shaped covers. A terminal strip with connecting contacts is also disposed on the upper side of the board. Connecting wires of the terminal strip project into the flexible printed circuit board through an opening in the board.

SUMMARY OF THE INVENTION

It is accordingly an object of the invention to provide a controller for a motor vehicle which overcomes the above-mentioned disadvantages of the prior art devices of this general type, which permits cost-effective manufacture and a reliable, vibration-proof, hermetically sealed electrical connection between a control circuit and electrical components which are disposed remotely therefrom.

With the foregoing and other objects in view there is provided, in accordance with the invention, a controller for a motor vehicle. The controller contains a sealed housing, an electronic control circuit disposed in the sealed housing, a conductor support made of plastic and having integrated electrical conductors, a flexible printed circuit board leading through the sealed housing and leading onto the conductor support, at least one electrical component, a control circuit, and a component support supporting the electrical component. The conductor support is attached to the component support in such a way that the flexible printed circuit board rests with a same side on the component support and on the conductor support. The electrical component is electrically connected to the control circuit through the integrated electrical conductors and the flexible printed circuit board. The conductor support and the component support are formed as separate parts.

According to the invention, the flexible printed circuit board forms an electrical connection between the control circuit that is disposed in the sealed housing and the conductors that are integrated or embedded in the conductor supports. The separate conductor support can be mechanically connected to the component support in such a way that the flexible printed circuit board or film comes to rest on the conductor support. In this position it is possible to form a voltage-free and vibration-resistant electrical connection between the conductors and the conductor tracks of the flexible printed circuit board, for example by soldering, bonding or preferably welding.

Metallic objects such as wires, metal strips or punched grids are suitable as cost-effective conductors, and are preferably injection molded in the conductor support, pressed into it or fitted into a groove. In addition, the conductors can be implemented by MID technology, i.e. by metallized plastic surfaces.

In one particularly preferred embodiment of the invention, the conductor support is attached to the component support with play. The flexible properties of the flexible printed circuit board permit play between the conductor support and the component support without the electrical contact points between the flexible printed circuit board and the conductors being subjected to unacceptable loading. The play that is provided between the contact carrier and the conductor support permits one or more components of the conductor support to be fitted easily and precisely into one installation location.

It is particularly advantageous here if the conductor support has a disconnectable section on which a plug-type connector is disposed. This significantly improves the mobility of the section that is fitted with the plug-type connector. The disconnectable connection between the sections can be linear or spot-shaped. Given a disconnectable spot-shaped connection with a certain distance between the residual contours of the sections, the sections cannot impede one another or rub against one another when they move in relation to one another.

The flexible printed circuit board is preferably a flexible film (flex film) with conductor tracks made of copper and polyimide layers covering them.

During the manufacture of the controller, a metallic conductor is integrated or incorporated into the body of the conductor support. The conductor support can be used to easily form electrical contacts between the flexible printed circuit board, which is required for the sealed housing bushing, and remotely disposed electrical components. The electrical components may be disposed on the conductor support and/or on the component support here.

A particularly preferred application of the invention contains a transmission controller that is completely integrated into the housing of an automatic transmission that is filled with oil.

In accordance with an added feature of the invention, the conductor support is attached to the component support in such a way that the conductor support can be moved longitudinally and transversely with respect to a plane of the flexible printed circuit board.

In accordance with an additional feature of the invention, the conductor support is inserted into the component support from a side that faces away from the flexible printed circuit board.

In accordance with another feature of the invention, the component support has a recess disposed outside of an area of the sealed housing; and the conductor support has a web with contacts and the web is disposed in the recess.

In accordance with a further feature of the invention, the flexible printed circuit board rests with a same side on the component support and on the conductor support.

In accordance with another added feature of the invention, the flexible printed circuit board has conductor tracks making electrical contact with the integrated electrical conductors on the conductor support by a welded connection.

In accordance with another additional feature of the invention, the conductor support is manufactured in one piece, and has at least two sections that can be at least partially separated from one another and can move with respect to one another. Each of the sections has a mechanical connection to the component support, and an electrical connection between the integrated electrical conductors and the flexible printed circuit board.

In accordance with another further feature of the invention, the integrated electrical conductors are punched strips of sheet metal, and the punched strips of sheet metal are encapsulated by injection molding plastic or the conductor support.

In accordance with a further added feature of the invention, the electrical component is attached to the component support and has an electrical connection to the control circuit, and part of an electrical connection between the electrical component and the control circuit is led to the conductor support.

In accordance with a concomitant feature of the invention, the controller is integrated into a housing of an automatic transmission.

Other features which are considered as characteristic for the invention are set forth in the appended claims.

Although the invention is illustrated and described herein as embodied in a controller for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
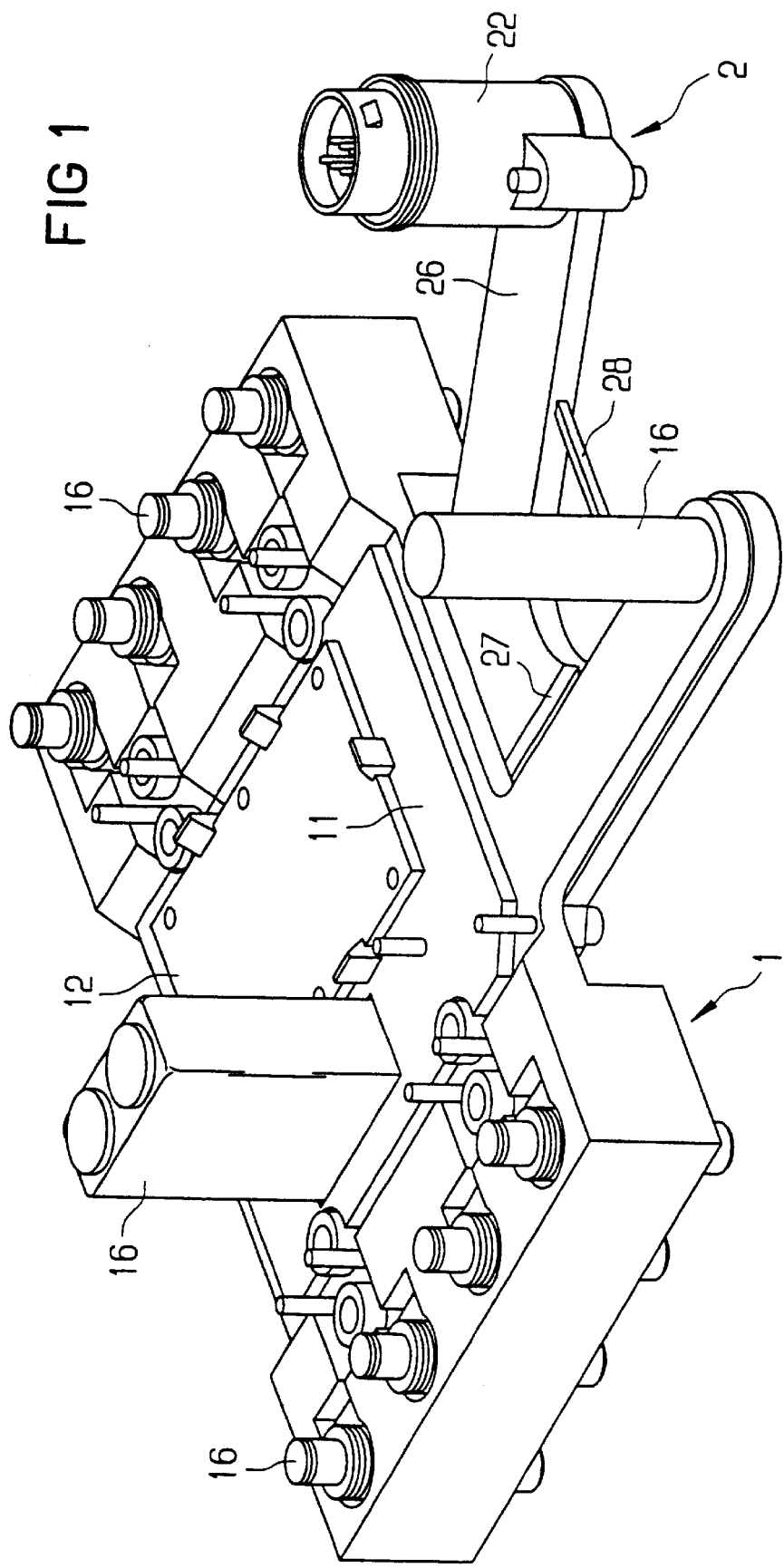
FIG. 1 is a perspective view of a transmission controller according to the invention.

Referring now to the figures of the drawing in detail and first, particularly, to FIG. 1 thereof, there is shown a transmission controller which is intended for installation in a housing of an automatic transmission of a motor-vehicle which is filled with oil.

A flexible printed circuit board 11 or flex film extends out of a housing onto a component support 1. The housing is hermetically sealed with respect to transmission oil by a cooling plate 12. The flexible printed circuit board 11 is laminated onto the cooling plate 12. Electrical components 16 are disposed on the component support 1.

These are solenoid valves and two rotational speed sensors.

A conductor support 2 made of plastic is attached to the underside of the component support 1. The conductor support 2 has a plug-type connector 22 or plug as an electrical component at its end remote from the component support 1. The plug-type connector 22 is inserted in a sealed fashion into a corresponding opening in the transmission housing in order to form a connection to a data bus inside the vehicle and to a power supply. The housing of the plug-type connector 22 is manufactured in one piece with the conductor support 2. The flexible printed circuit board 11 rests, with its side facing away from the cooling plate 12, both on the component support 1 and on the conductor support 2.

Figure 2:
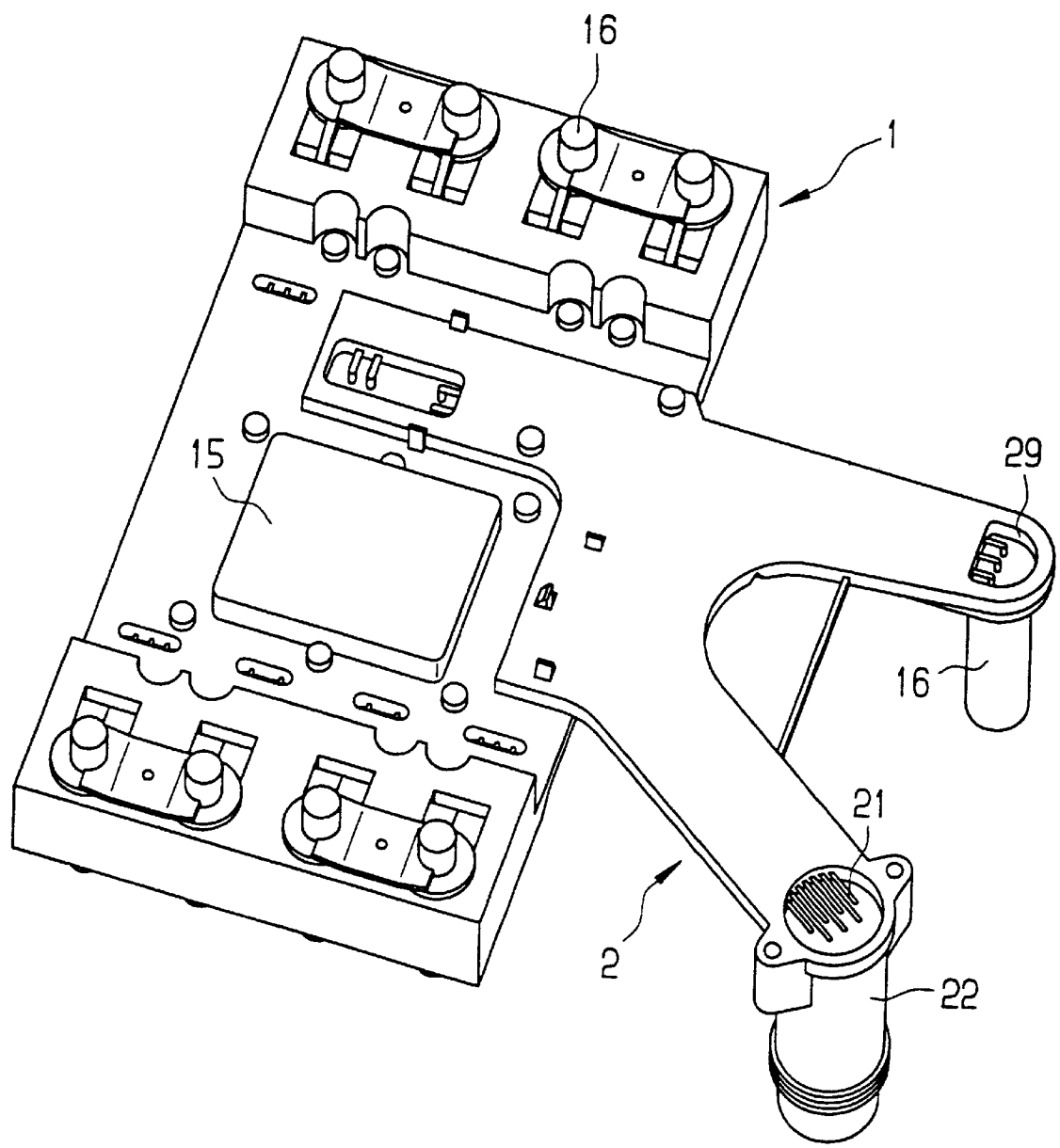
FIG. 2 is a rear perspective view of the transmission controller.

FIG. 2 shows the underside of the controller. The conductor support 2 is inserted and locked into the component support 1 in the vicinity of a housing trough 15 that holds an electronic control circuit. The conductor support 2 is inserted into the component support 1 from the side that faces away from the flexible printed circuit board.

Figure 3:
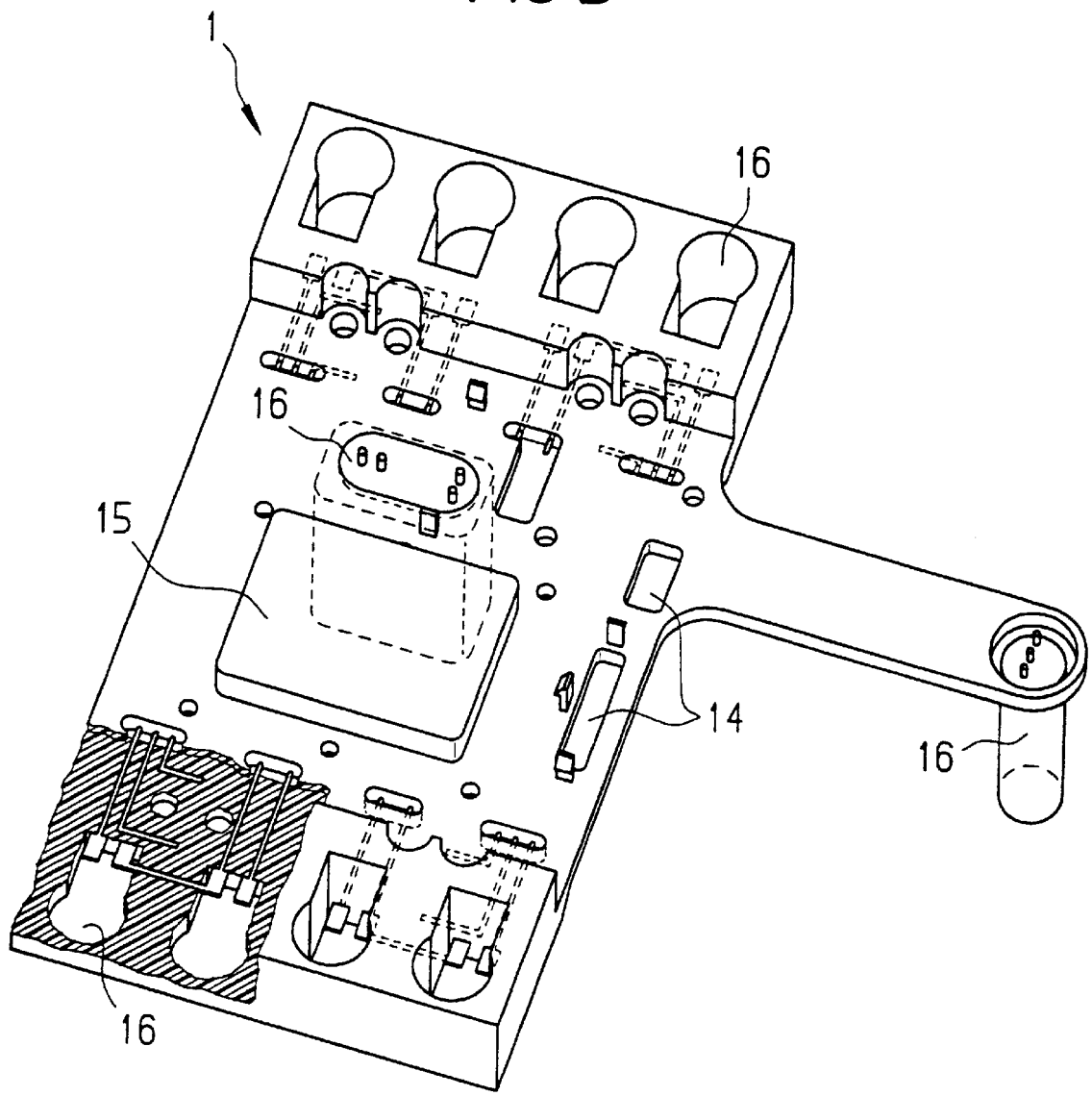
FIG. 3 is a perspective view of a component support of the controller.

FIG. 3 represents the component support 1 before the insertion of the conductor support 2. Recesses 14 into which a web, provided with electrical contacts, of the conductor support 2 can be inserted, are present in the component support 1. The recesses 14 are outside the housing formed by a housing trough 15 and the cooling plate 12.

Figure 4:
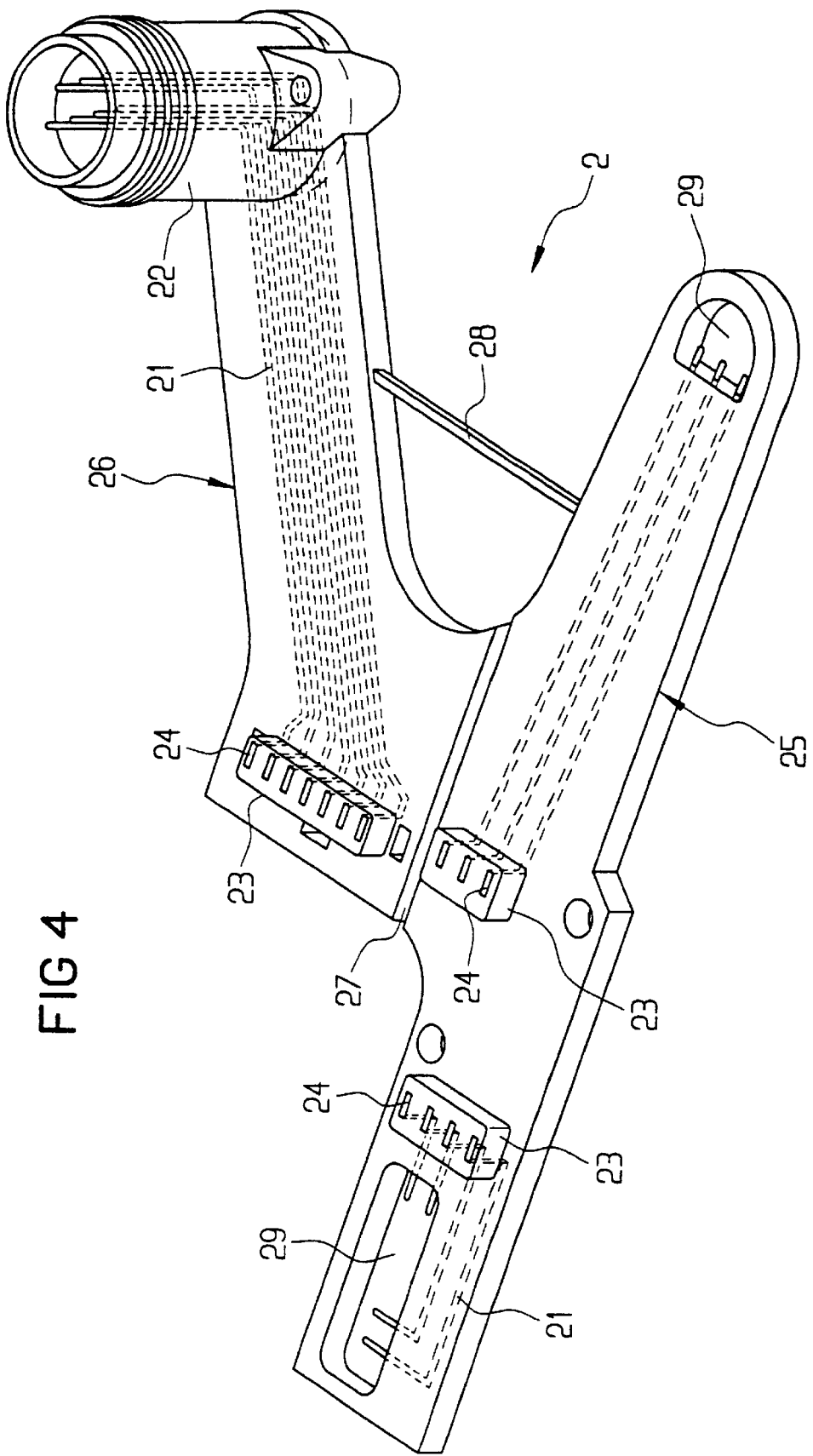
FIG. 4 is a perspective view of a conductor support of the controller.

FIG. 4 illustrates the conductor support 2 with conductors 21 in the form of punched strips of sheet metal or punched grids. The conductors 21 are encapsulated by a plastic material of the conductor support 2 by injection moulding. The conductors 21 form contacts 24 on contact blocks or webs 23, corresponding contact points or conductor tracks of the flexible printed circuit board 11 being placed in electrical contact with the contacts 24.

The webs 23 project from the supporting face of the conductor support 2 on the component support 1 to such an extent that the webs 23 which are inserted into the recesses 14 terminate flush with the surface of the component support 1 which serves as a conductor track support. The conductors 21 extend from the webs 23 to electrical components, namely to the contact pins of the plug-type connector 22 of the conductor support 2 and to the rotational speed sensors 16 that are disposed on the component support 1.

The conductor support 2 is manufactured and installed as an integral part. However, after the conductor support 2 is attached to the component support 1, a certain degree of mobility of a section 26 is desired so that the plug-type connector 22 can more easily be fitted into a housing opening of the transmission. For this purpose, the component support 2 can be separated along a weakened section or a groove 27 and released from a connecting web 28. The groove 27 constitutes a predetermined break point. It results in two sections 25 and 26 that are separated from one another. The conductor support 2 thus combines the advantages of cost-effective fabrication and mounting as well as of simplified logistics with the advantages of mobility that are provided by configuring the conductor support 2 in two parts.

Each of the two sections 25 and 26 respectively has a mechanical connection to the component support 1 and an electrical connection between the conductors 21 and the conductor tracks of the flexible printed circuit board 11.

The mechanical and the electrical connections between the component support 1 and the conductor support 2, or the sections 25 and 26 respectively, are mechanically decoupled from one another.

There are cut-outs or openings 29 in regions of the conductor support 2 at which the electrical components are provided. The conductors 21 extend into the openings 29. Through the openings 29, the contact points between the conductors 21 and the terminals of the electrical components 16 are accessible from the outside for the formation of contacts. The electrical connections between the conductors 21 and the electrical components 16 on the one hand, and the flexible printed circuit board 11 on the other hand, can be manufactured in one process step after the attachment of the conductor support 2 to the component support 1. Laser welding is particularly suitable for this.

Figure 5:
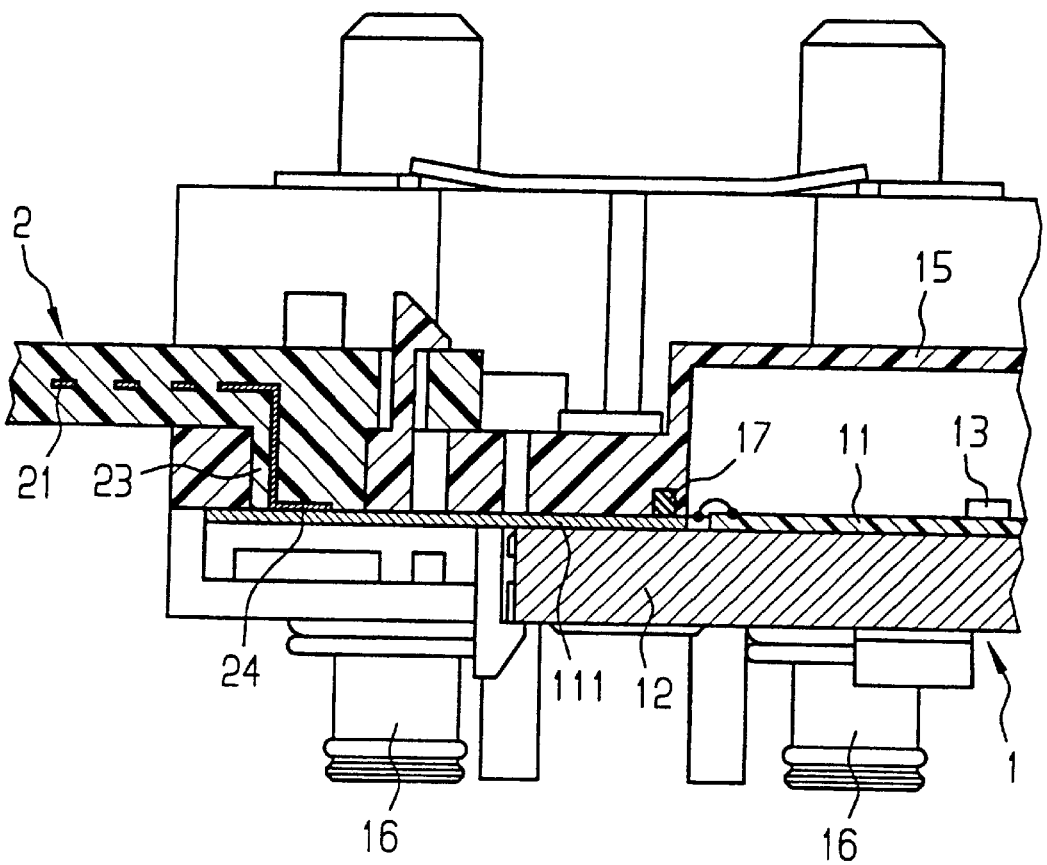
FIG. 5 is a partial, sectional view of a section through the transmission controller.

FIG. 5 shows the component support 1 to which the conductor support 2 is locked with play. Play between 1 mm and 5 mm can be provided here. This permits longitudinal and lateral movement of the conductor support 2 or of one of its sections with respect to the plane of the flexible printed circuit board 111 or with respect to the component support 1. Owing to the mobility of the conductor support 2, the plug-type connector 22 of the controller can be inserted in a precise and sealed fashion into an opening in the wall of the transmission housing. Unacceptable loading of the contact points between the flexible printed circuit board 11 and the conductors 21 is avoided because the contact points are disposed on the conductor support 2. The flexible printed circuit board 11 is, with the exception of the electrical contacts in the region of the conductor support, loosely disposed with a small degree of excess material. As a result, it is insensitive to tensile loading or thrust loading. In addition, a tensile strain relief may be provided. This can be implemented by pins of the web that secure the flexible printed circuit board.

In the housing formed from the housing trough 15 and the cooling plate 12, a control circuit 13 is disposed on a ceramic substrate. Conductor tracks of the ceramic substrate are placed in electrical contact with the conductor tracks of the flexible printed circuit board 11. The flexible printed circuit board 11 is led in a sealed fashion to the outside from the inside of the housing providing a seal 17 in the process. On the outside, conductor tracks 111 formed on the printed circuit board 11 make contact with the contacts 24 which are disposed on the webs 23 of the conductor support 2. The conductors 21 are led to the electrical components 16. In this way, an electrical connection is formed between the control circuit 13 and the electrical components 16.

We claim:

1. A controller for a motor vehicle, comprising:

a sealed housing;

an electronic control circuit disposed in said sealed housing;

a conductor support made of plastic and having integrated electrical conductors;

a flexible printed circuit board leading through said sealed housing and leading onto said conductor support;

at least one electrical component;

a control circuit; and a component support supporting said electrical component, said conductor support attached to said component support in such a way that said flexible printed circuit board rests with a same side on said component support and on said conductor support, and said electrical component electrically connected to said control circuit through said integrated electrical conductors and said flexible printed circuit board, said conductor support and said component support being separate parts.

2. The controller according to claim 1, wherein said conductor support is mechanically connected with play to said component support.

3. The controller according to claim 1, wherein said conductor support is attached to said component support in such a way that said conductor support can be moved longitudinally and transversely with respect to a plane of said flexible printed circuit board.

4. The controller according to claim 1, wherein said conductor support is inserted into said component support from a side which faces away from said flexible printed circuit board.

5. The controller according to claim 1, wherein:

said component support has a recess formed therein disposed outside of an area of said sealed housing; and said conductor support has a web with contacts and said web is disposed in said recess.

6. The controller according to claim 1, wherein said flexible printed circuit board rests with a same side on said component support and on said conductor support.

7. The controller according to claim 1, wherein said flexible printed circuit board has conductor tracks making electrical contact with said integrated electrical conductors on said conductor support by a welded connection.

8. The controller according to claim 1, wherein said conductor support is manufactured in one piece, and has at least two sections which can be at least partially separated from one another and can move with respect to one another.

9. The controller according to claim 8, wherein each of said sections has a mechanical connection to said component support, and an electrical connection between said integrated electrical conductors and said flexible printed circuit board.

10. The controller according to claim 1, wherein said integrated electrical conductors are punched strips of sheet metal, and said punched strips of sheet metal are encapsulated by injection molding one of a plastic and said conductor support.

11. The controller according to claim 1, wherein said electrical component is attached to said component support and has an electrical connection to said control circuit, and part of an electrical connection between said electrical component and said control circuit is led to said conductor support.

12. The controller according to claim 1, wherein the controller is integrated into a housing of an automatic transmission.

* * * * *